(12) United States Patent
Frazier

(10) Patent No.: US 7,038,526 B1
(45) Date of Patent: May 2, 2006

(54) METHOD AND APPARATUS FACILITATING OPERATION OF A RESONANT TUNNELING DEVICE AT A HIGH FREQUENCY

(75) Inventor: Gary A. Frazier, Garland, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/762,858

(22) Filed: Jan. 21, 2004

(51) Int. Cl.
*H03K 17/58* (2006.01)

(52) U.S. Cl. ..................................... 327/499
(58) Field of Classification Search ............... 327/443, 327/499, 570, 449, 110; 331/56, 74, 96, 331/107 T; 377/128
See application file for complete search history.

(56) References Cited

U.S. PATENT DOCUMENTS

| | | | | |
|---|---|---|---|---|
| 4,831,340 | A * | 5/1989 | Sollner ........................ | 331/76 |
| 5,132,557 | A * | 7/1992 | Uchida et al. ................ | 327/92 |
| 5,223,802 | A * | 6/1993 | Harvey et al. .......... | 331/177 R |
| 5,930,323 | A * | 7/1999 | Tang et al. .................... | 377/77 |
| 6,348,887 | B1  | 2/2002 | Broekaert ................... | 341/155 |
| 6,359,520 | B1* | 3/2002 | Frazier et al. ................ | 331/66 |
| 6,509,859 | B1  | 1/2003 | van der Wagt ............. | 341/155 |
| 6,756,649 | B1* | 6/2004 | Moddel et al. ............. | 257/425 |

OTHER PUBLICATIONS

Richard H. Mathews, et al., "A New RTD-FET Logic Family", Proceedings of the IEEE, vol. 87, No. 4, Apr. 1999, pp. 596-605.

* cited by examiner

*Primary Examiner*—My-Trang Nu Ton
(74) *Attorney, Agent, or Firm*—Baker Botts L.L.P.

(57) ABSTRACT

An apparatus includes a circuit having first and second portions which are each coupled between first and second nodes. The first portion includes a resonant tunneling device, and the second portion has a reactance that includes, at a selected frequency, a complex conjugate reactance of a reactance of the resonant tunneling device. The complex conjugate reactance substantially cancels the reactance of the resonant tunneling device at the selected frequency.

27 Claims, 3 Drawing Sheets

US 7,038,526 B1

METHOD AND APPARATUS FACILITATING OPERATION OF A RESONANT TUNNELING DEVICE AT A HIGH FREQUENCY

TECHNICAL FIELD OF THE INVENTION

This invention relates in general to high-frequency circuits, and more particularly, to high-frequency circuits which include resonant tunneling devices.

BACKGROUND OF THE INVENTION

There are a variety of different types of circuits which use resonant tunneling devices, such as resonant tunneling diodes. A resonant tunneling diode (RTD) inherently includes an intrinsic capacitance, which is generally negligible during operation at frequencies below a transition frequency of approximately 100 GHz. In particular, below approximately 100 GHz, the intrinsic capacitance has a relatively high reactive impedance in comparison to the intrinsic resistance of the RTD, and thus the resistance dominates and the intrinsic capacitance is effectively negligible. However, the reactance of the intrinsic capacitance progressively decreases as the frequency progressively increases. Consequently, above the transition frequency, the impedance of the RTD is dominated by the intrinsic capacitance, rather than the intrinsic resistance.

Since it is the resistance characteristic of an RTD which is of interest to circuit designers, the intrinsic capacitance has the effect of rendering the RTD substantially unsuitable for use at frequencies above its transition frequency. Consequently, circuit designers avoid using an RTD in any circuit that operates at a frequency higher than the transition frequency of that RTD. However, since RTDs are the fastest known semiconductor switches that have intrinsic gain, there are a variety of high-frequency circuits in which the use of RTDs would be highly desirable, except for the fact that these circuits have operating frequencies well above the transition frequency of the typical RTD.

SUMMARY OF THE INVENTION

From the foregoing it may be appreciated that a need has arisen for a method and apparatus for counteracting the effect of the intrinsic capacitance of a resonant tunneling device in a high-frequency circuit. According to the present invention, a method and apparatus are provided to address this need in the context of a circuit that includes a first portion which is coupled between first and second nodes and has a resonant tunneling device, and that includes a second portion which is also coupled between the first and second nodes. The method and apparatus involve: causing the second portion to exhibit at a selected frequency an electrical reactance that includes a complex conjugate reactance of a reactance of the resonant tunneling device at the selected frequency, so that the complex conjugate reactance substantially cancels the reactance of the resonant tunneling device at the selected frequency.

BRIEF DESCRIPTION OF THE DRAWINGS

A better understanding of the present invention will be realized from the detailed description which follows, taken in conjunction with accompanying drawings, in which.

DETAILED DESCRIPTION

Figure 1:
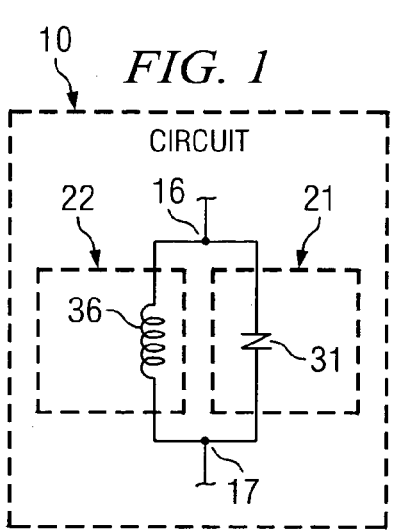
FIG. 1 is a schematic circuit diagram of an apparatus which is a circuit that embodies aspects of the present invention.

FIG. 1 is a schematic circuit diagram of an apparatus 10 which is a circuit that embodies aspects of the present invention. FIG. 1 does not show details of the entire circuit 10, but instead shows only a selected portion of the circuit which is sufficient to convey an understanding of the present invention. The circuit 10 includes two nodes 16 and 17, a circuit portion 21 which is coupled between the nodes 16 and 17, and a further circuit portion 22 which is also coupled between the nodes 16 and 17.

The circuit portion 21 includes a resonant tunneling diode (RTD) 31, and each end of the RTD 31 is coupled to a respective one of the nodes 16 and 17. The RTD 31 is a device of a type known in the art, and is therefore not described here in detail.

The circuit portion 22 includes a coil or inductor 36, and each end of the inductor 36 is coupled to a respective one of the nodes 16 and 17. The inductor 36 has an impedance characteristic which is selected as a function of an impedance characteristic of the RTD 31, in a manner explained in more detail below in association with FIG. 2.

Figure 2:
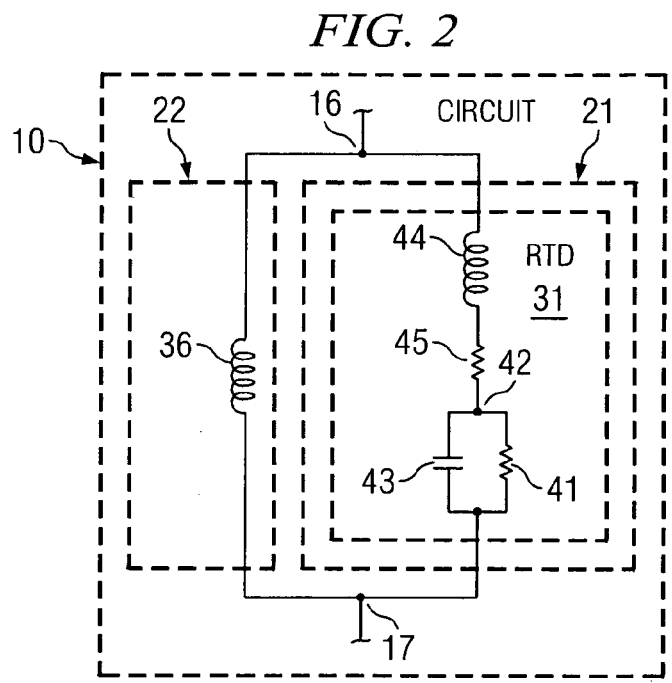
FIG. 2 is a schematic circuit diagram of the same circuit shown in FIG. 1, except that the symbol for one of the circuit components has been replaced with an equivalent circuit.

More specifically, FIG. 2 is a schematic circuit diagram showing the circuit 10 of FIG. 1, except that in FIG. 2 the circuit symbol for the RTD 31 has been replaced with an equivalent circuit. In particular, as shown in FIG. 2, the equivalent circuit for the RTD 31 includes an intrinsic resistance which is represented by a resistor 41 coupled between the node 17 and a node 42, and also includes an intrinsic capacitance represented by a capacitor 43 coupled between the nodes 17 and 42. In other words, the capacitor 43 is coupled in parallel with the resistor 41. The equivalent circuit for the RTD 31 also includes a contact inductance and a contact resistance which are represented in FIG. 2 by an inductor 44 and a resistor 45 that are coupled in series with each other between the node 42 and the node 16. That is, in the equivalent circuit 31, the inductor 44 and the resistor 45 represent the electrical effects of the electrical contacts to the actual RTD. For simplicity and clarity in the following discussion, it is assumed that the inductance of the inductor 44 and the resistance of the resistor 45 are nominally small in comparison to the other circuit elements.

The capacitor 43 represents the junction capacitance of the RTD 31. The resistor 41 represents the effective resistance between the contacts of the RTD 31. All of these equivalent electrical parameters are, in general, a function of an electrical potential applied across the RTD between the nodes 16 and 17. The intrinsic resistance 41 of the RTD is typically very non-linear, and varies from positive to negative values as a strong function of the electrical bias across the RTD. The advantage of using an RTD is obtained primarily by exploiting the non-linear characteristic of the resistance 41, for example to construct devices such as switches, amplifiers, and oscillators.

Every RTD has a maximum useful frequency of operation called the transition frequency. The typical RTD, which is made from materials such as indium, gallium, aluminum and arsenide, has a transition frequency of approximately 100 GHz. However, it will be recognized that the transition frequency may vary from RTD to RTD, and for any given RTD could be higher or lower than 100 GHz, depending on the particular design of that RTD, and its physical size when manufactured. When an RTD is operated at frequencies below its transition frequency, or in other words below about 100 GHz, the relatively low value of its intrinsic capacitance 43 presents a relatively high reactive impedance to the external world, so that the intrinsic capacitance is nominal in comparison to the intrinsic resistance of the RTD, as viewed from externally of the RTD. For example, in a typical RTD having 4 square micrometers of contact area, the intrinsic capacitance may be on the order of about 20 femtoFarads, and the intrinsic resistance may be on the order of about −300 to 300 ohms, depending on the electrical bias. At a frequency of 1 GHz, the reactive impedance of the intrinsic capacitance in this typical RTD would be about:

$$\frac{1}{j \cdot 2\pi \cdot e9 \cdot 20 \cdot 10^{-15}} = -7960j \text{ ohms,}$$

where j is the square root of −1, e9 represents the selected frequency, and $20 \cdot 10^{-15}$ is the intrinsic capacitance of the exemplary RTD (20 femtoFarads). This value of reactive impedance is very high in comparison to the intrinsic resistance of the RTD. At low frequencies, the electrical effect of the parallel combination of the capacitor 43 and the resistor 41 would essentially be that of the resistor 41 alone.

The intrinsic capacitive reactance progressively decreases toward −0j ohms as the operating frequency of the RTD progressively increases. As a result, above the transition frequency of approximately 100 GHz, the intrinsic capacitance begins to dominate the intrinsic resistance, and high frequency current in the RTD is shunted away from the resistor 41 by the lower reactance of the capacitor 43. Referring to the previous example, the intrinsic capacitive reactance at 100 GHz would drop to about −79j ohms, which would be significantly less than the RTD intrinsic resistance over a wide range of bias conditions. The reduced impedance of the intrinsic capacitance reduces the usefulness of the RTD as an electrical switch, amplifier, or oscillator. Therefore, the RTD does not operate effectively above its transition frequency of approximately 100 GHz. For this reason, circuit designers have previously avoided using an RTD in a circuit which is intended to function at a frequency above the transition frequency of the RTD, and significant effort has been expended in trying to design and develop RTDs with lower intrinsic capacitances, in order to increase the RTD transition frequency.

According to one form of the present invention, the circuit portion 22 is provided in order to counteract the effect of the intrinsic capacitance at 43, and thereby permit the RTD 31 to operate in a substantially normal manner at a frequency in excess of its transition frequency of approximately 100 GHz. As discussed above, the circuit portion 22 in FIG. 2 is the discrete inductor 36. The inductor 36 is selected or configured to have an inductance value which is matched to the intrinsic capacitance at 43, in a manner so that the inductance-capacitance (LC) combination of 43 and 36 will exhibit LC resonance at a selected frequency. Stated more generically, the circuit portion 22 provides a reactive impedance at the selected frequency which is the complex conjugate of the reactive impedance of the intrinsic capacitance at 43. At the selected frequency of LC resonance, the reactive impedances of the inductor 36 and capacitor 43 additively cancel, and the impedance of the LC combination effectively achieves a very large value. Therefore, and since the resistance at 41 represents an impedance which is substantially lower, the resistance 41 will dominate the impedance characteristic of the RTD 31 at that selected frequency.

The selected frequency can be well above the RTD transition frequency of approximately 100 GHz, up to approximately 1,000 GHz. Above 1000 GHz there are secondary effects, such as those due to the contact inductance 44 and contact resistance 45 of the RTD, which prevent further exploitation of LC resonance as a technique for raising the effective transition frequency of the RTD in a circuit. Since the LC resonance peaks only at the selected frequency, it will be recognized that the circuit 10 is not configured for wideband operation above the transition frequency of the RTD 31. Instead, the RTD 31 is tuned for operation at a single resonant frequency (which is the selected frequency), or for operation within a narrow range of frequencies which is centered about the selected frequency. Nevertheless, there are many types of circuits that have a specific predetermined operational frequency, such as the fixed frequency of a clock signal used within a digital timing circuit or a signal quantizing circuit. In such circuits, the configuration shown in FIG. 1 permits the RTD 31 to operate substantially normally at a selected frequency above 100 GHz, where the intrinsic capacitance at 43 would otherwise prevent satisfactory operation of the RTD 31. Moreover, since the reactive impedance of the RTD is canceled at the selected frequency, the RTD presents an essentially unreactive resistance to the external world, thus simplifying the interface of the circuit to normally-resistive clock or biasing sources.

Figure 3:
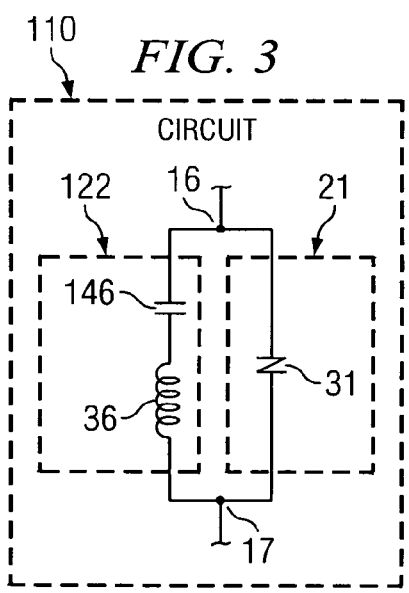
FIGS. 3–10 are each a schematic circuit diagram of a respective different alternative embodiment of the circuit of FIG. 1.

FIG. 3 is a schematic circuit diagram of an apparatus in the form of a circuit 110, which is an alternative embodiment of the circuit 10 of FIG. 1. Equivalent parts are identified with the same reference numerals, and the following discussion focuses primarily on the differences. In this regard, the only difference in FIG. 3 is that the circuit portion 22 of FIG. 1 has been replaced with a circuit portion 122, in which a direct current (DC) blocking capacitor 146 is provided between the inductor 36 and the node 16. The capacitance of the capacitor 146 is selected so that, at frequencies below the RTD transition frequency of approximately 100 GHz, the blocking capacitor 146 acts as an open circuit, and at frequencies above the RTD transition frequency, the blocking capacitor acts as a short circuit. The blocking capacitor 146 permits the RTD 31 to have two different modes of operation.

In particular, since the blocking capacitor 146 essentially acts as a short circuit at frequencies above the RTD transition frequency, the circuit 110 of FIG. 3 effectively becomes equivalent to the circuit 10 of FIG. 1. Consequently, the RTD 31 of FIG. 3 is capable of normal operation within a narrow frequency band about the selected resonant frequency. On the other hand, since the capacitor 146 essentially acts as an open circuit below the RTD transition frequency, it has the effect of disconnecting the inductor 36 from the nodes 16 and 17. Consequently, the RTD 31 of FIG. 3 is capable of normal operation within a wide frequency band which includes almost any frequency below its transition frequency. Thus, the RTD 31 in the circuit of FIG. 3 is capable of a narrowband mode of operation at a selected frequency above its transition frequency, and is also capable of a wideband mode of operation at virtually any frequency below its transition frequency.

Figure 4:
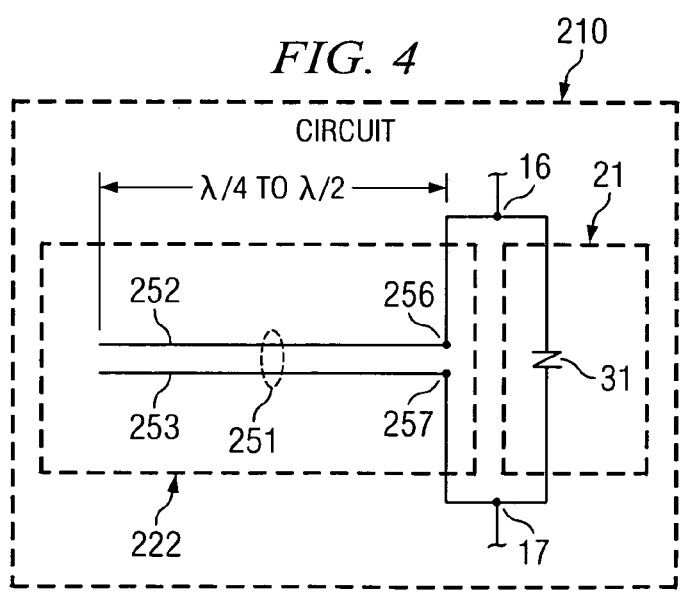

FIG. 4 is a schematic circuit diagram of an apparatus in the form of a circuit 210, which is another alternative embodiment of the circuit 10 of FIG. 1. Equivalent parts are identified by the same reference numerals, and the following discussion focuses primarily on the differences.

In FIG. 4, the circuit portion 22 of FIG. 1 has been replaced with a circuit portion 222. The circuit portion 222 includes a transmission line 251, which has two conductors 252 and 253. The conductors 252 and 253 are each connected at one end to a respective circuit node 256 or 257, and the circuit nodes 256 and 257 are respectively coupled to the circuit nodes 16 and 17. The opposite ends of the conductors 252 and 253 are not connected to anything. The transmission line 251 is thus a transmission line of the type commonly known as an open line.

In a manner similar to that discussed above in association with FIGS. 1 and 2, the circuit portion of 222 of FIG. 4 is configured to provide between the nodes 16 and 17, at a selected frequency, an impedance which includes a reactive impedance characteristic that is the complex conjugate of the intrinsic reactance of the capacitance 43 within the RTD 31. In more detail, the transmission line 251 has an electrical length which is between one-quarter and one-half of a wavelength at the selected frequency. When the circuit 210 is operating at the selected frequency, the inductive reactance of the transmission line 251 will have a value which is the complex conjugate of the intrinsic capacitive reactance within the RTD 31. At the selected frequency, this causes LC resonance between the transmission line 251 and the RTD capacitance at 43. Consequently, for the same reasons discussed above in association with the embodiment of FIG. 1, the RTD 31 will be capable of substantially normal operation within a narrow frequency band that is centered about the selected frequency.

Since the conductors 252 and 253 of the transmission line 251 are not directly connected to each other, it will be recognized that the transmission line 251 acts as an open circuit at lower frequencies. Consequently, the circuit portion 222 is effectively removed from the circuit 210 at lower frequencies, and the RTD 31 is capable of normal operation throughout a relatively wide band of frequencies below the RTD transition frequency. Thus, like the circuit 110 of FIG. 3, the RTD 31 in the circuit 210 of FIG. 4 effectively has two different modes of operation, including a narrowband mode of operation at a single selected frequency above the RTD transition frequency, and a wideband mode of operation throughout a range of frequencies below the transition frequency.

Figure 5:
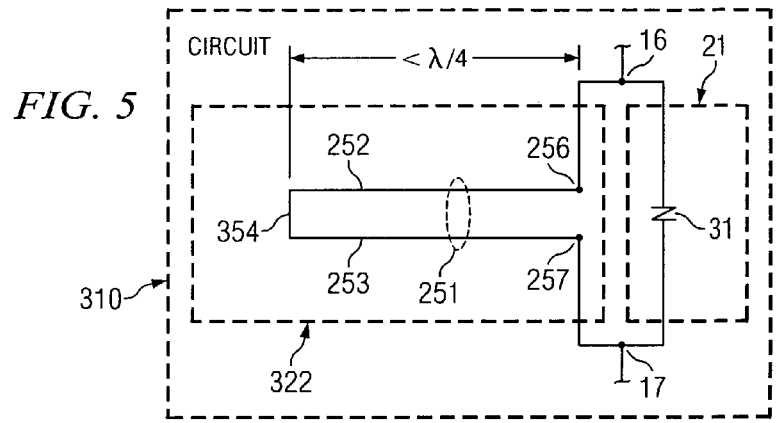

FIG. 5 is a schematic circuit diagram of an apparatus in the form of a circuit 310, which is a further alternative embodiment of the circuit 210 of FIG. 4. Equivalent parts are identified by the same reference numerals, and the following discussion focuses primarily on the differences. In FIG. 5, the circuit portion 222 of FIG. 4 has been replaced with a circuit portion 322. The circuit portion 322 is identical to the circuit portion 222, except that a short 354 is provided between the conductors 252 and 253 at the distal end of the transmission line 251. Also, the transmission line 251 in FIG. 5 has an electrical length which is less than one-quarter of a wavelength at the selected resonant frequency, so as to provide an inductance value which causes LC resonance at the selected frequency.

The operation of the circuit 310 of FIG. 5 is similar to the operation of the circuit 10 of FIG. 1, which has already been described above. Since the conductors 252–253 of the transmission line 251 are shorted at 354, the circuit portion 322 acts as a short circuit at lower frequencies. Consequently, like the circuit 10 of FIG. 1, the circuit 310 of FIG. 5 has a single narrowband mode of operation centered about the selected frequency above the RTD transition frequency, but does not have a second mode of operation at frequencies below the transition frequency.

Figure 6:
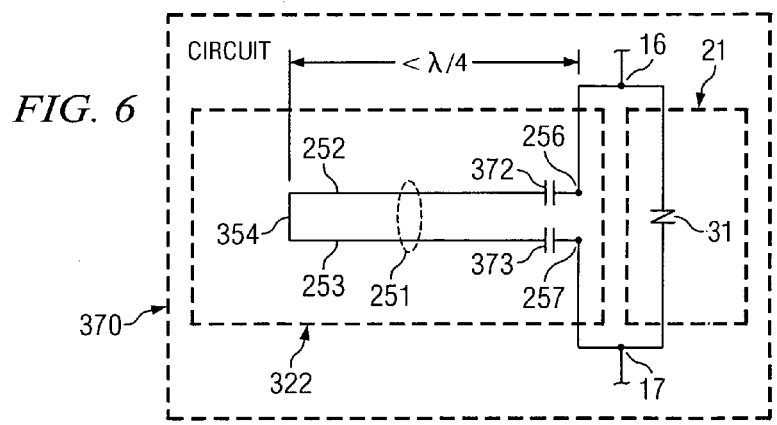

FIG. 6 is a schematic circuit diagram of an apparatus in the form of a circuit 370, which is an alternative embodiment of the circuit 310 of FIG. 5. Equivalent parts are identified by the same reference numerals, and the following discussion focuses primarily on the differences. In particular, the only difference between the embodiments of FIGS. 5 and 6 is that, in FIG. 6, respective DC blocking capacitors 372 and 373 have been added in the conductors 252 and 253 of the transmission line 251. Each of the capacitors 372 and 373 has its capacitance value selected so that it acts as an open circuit at frequencies below the RTD transition frequency of approximately 100 GHz, and acts as a short circuit at frequencies above the RTD transition frequency. Consequently, in a manner similar to that discussed above in association with the blocking capacitor 146 of FIG. 3, the blocking capacitors 372 and 373 permit the RTD 31 in the circuit of FIG. 6 to have two different modes of operation.

In particular, since the blocking capacitors 372 and 373 each essentially act as a short circuit at frequencies above the RTD transition frequency, the circuit 370 of FIG. 6 effectively becomes equivalent to the circuit 310 of FIG. 5. Consequently, the RTD 31 of FIG. 6 is capable of normal operation within a narrow frequency band about the selected resonant frequency. On the other hand, since the capacitors 372 and 373 each essentially act as an open circuit below the RTD transition frequency, they have the effect of disconnecting the transmission line 251 from the nodes 16 and 17. Consequently, the RTD 31 of FIG. 6 is capable of normal operation within a wide frequency band which includes almost any frequency below its transition frequency. Thus, the RTD 31 in the circuit of FIG. 6 is capable of a narrowband mode of operation at a selected frequency above its transition frequency, and is also capable of a wideband mode of operation at virtually any frequency below its transition frequency.

Figure 7:
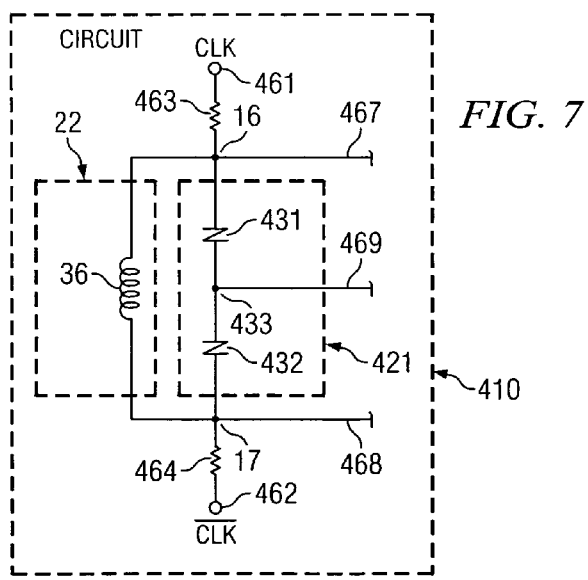

FIG. 7 is a schematic circuit diagram of an apparatus in a form of a circuit 410, which is yet another alternative embodiment of the circuit 10 of FIG. 1. Equivalent parts are identified by the same reference numerals, and the following discussion focuses primarily on the differences. The circuit 410 includes a circuit portion 421, which differs from the circuit portion 21 of FIG. 1 in that it includes two RTDs 431 and 432 coupled in series with each other between the circuit nodes 16 and 17. A circuit node 433 is thus defined between the two RTDs 431 and 432.

The circuit 410 includes two clock terminals 461 and 462. A resistor 463 is coupled between the clock terminal 461 and the node 16, and a further resistor 464 is coupled between the clock terminal 462 and the node 17. A clock signal CLK is applied to the clock terminal 461 and, in the embodiment of FIG. 7, is a sine wave. The complement of the clock signal CLK is applied to the clock 462. Stated differently, the clock signals applied to the clock terminals 461 and 462 are identical, except that they are 180° out of phase with each other.

In FIG. 7, the inductor 36 has an inductance value which is selected to resonate with the intrinsic capacitance within each of the RTDs 431 and 432. Consequently, the RTDs 431 and 432 can both operate substantially normally at a single selected resonant frequency above their transition frequencies. Thus, FIG. 7 represents an alternative to the approach of providing two separate inductors which are each coupled across a respective one of the RTDs 431 and 432 and which each resonate with the intrinsic capacitance of a respective RTD. In FIG. 7, the nodes 16, 17 and 433 of the circuit 410 can each be optionally coupled to other not-illustrated components within the circuit 410, as indicated diagrammatically at 467–469.

Figure 8:
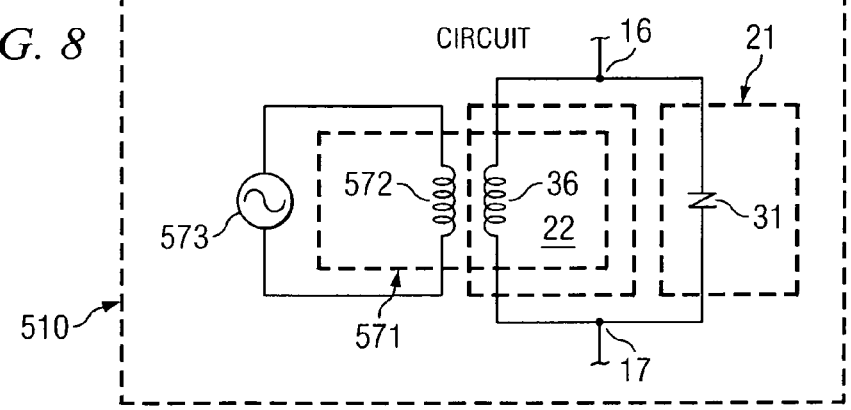

FIG. 8 is a schematic circuit diagram of an apparatus in the form of a circuit 510, which is another alternative embodiment of the circuit 10 of FIG. 1. Equivalent parts are identified by the same reference numerals, and the following discussion focuses primarily on the differences. It will be noted that the right half of FIG. 8 is identical to the circuit 10 of FIG. 1, and includes the circuit nodes 16 and 17, the circuit portion 21 with RTD 31, and the circuit portion 22 with inductor 36.

A difference is that, in FIG. 8, the inductor 36 is the secondary coil of a transformer 571, which also has a primary coil 572. The primary coil 572 is coupled across the output terminals of a signal source 573. The interaction of the inductance of the secondary coil 36 with the intrinsic capacitance in RTD 31 is identical to that described above in association with FIG. 1.

The circuit 510 of FIG. 8 shows that the inductor 36 in the circuit portion 22 can have more than one function. In particular, it can function to provide a reactive impedance which is the complex conjugate of the intrinsic capacitive reactance of the capacitor 43 within the RTD 31. Further, it can serve an additional function such as coupling a signal into the circuitry shown on the right side of FIG. 8, which in this case is the signal produced by the signal source 573 at the left side of FIG. 8.

Figure 9:
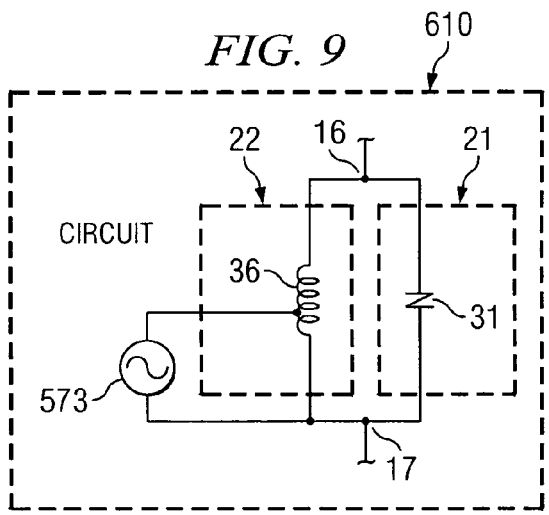

FIG. 9 is a schematic circuit diagram of an apparatus in the form of circuit 610, which is yet another alternative embodiment of the circuit 10 of FIG. 1. Equivalent parts are identified by the same reference numerals, and the following discussion focuses primarily on the differences. It will be noted that the circuitry in the right half of FIG. 9 is identical to the circuitry shown in FIG. 1, including the circuit nodes 16 and 17, the circuit portion 21 containing RTD 31, and the circuit portion 22 containing inductor 36. The left half of FIG. 9 has a signal source 573, with its output terminals respectively coupled to one end of the inductor 36, and a tap at an intermediate point along the inductor 36.

The circuit of FIG. 9 facilitates an efficient power transfer from the relatively low impedance signal source 573 to the relatively high impedance RTD circuit. Also, in a manner similar to that discussed above in association with FIG. 8, the inductor 36 in FIG. 9 serves two different functions, one of which is resonance with the intrinsic capacitance in the RTD 31, and the other of which is coupling a signal from the signal source 573 into the portion of the circuit which includes the RTD 31.

Figure 10:
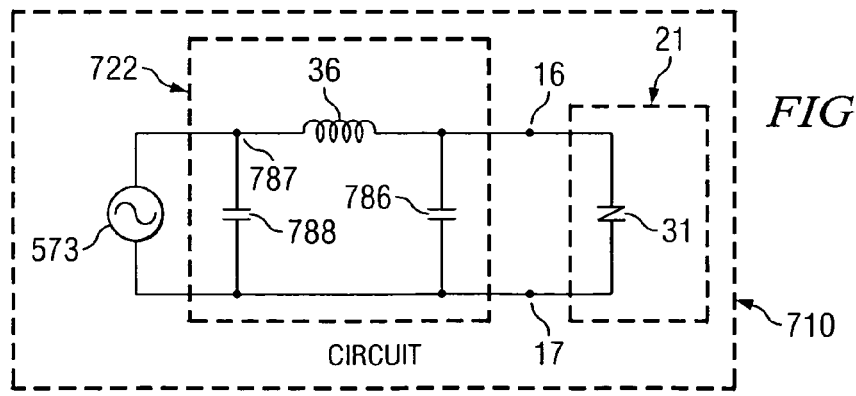

FIG. 10 is a schematic circuit diagram of an apparatus in the form of a circuit 710, which is still another alternative embodiment of the circuit 10 of FIG. 1. Equivalent parts are identified by the same reference numerals, and the following discussion focuses primarily on the differences. In this regard, the circuit portion 22 of FIG. 1 is replaced in FIG. 10 by a circuit portion 722.

The circuit portion 722 is an inductance-capacitance (LC) network, and includes the inductor 36. In particular, the inductor 36 has one end coupled to the circuit node 16, and its other end coupled to a circuit node 787. The circuit portion 722 also includes a capacitor 786 having its ends respectively coupled to the circuit nodes 16 and 17, and includes a further capacitor 788 having its ends respectively coupled to the circuit node 787 and the circuit node 17. The ends of the capacitor 788 are also respectively coupled to respective output terminals of the signal source 573.

The inductor 36 and the capacitors 786 and 788 have impedance values selected so that, between the nodes 16 and 17, the circuit portion 722 presents at a selected resonant frequency an impedance which is the complex conjugate impedance of the intrinsic capacitance within the RTD 31. Consequently, there is resonance at a selected frequency, in a manner comparable to that described above in association with the embodiment of FIG. 1.

With reference to FIG. 2, it has been assumed throughout the preceding discussion that the electrical effect of the RTD 31 is essentially controlled by the value of its intrinsic capacitance 43 and its intrinsic resistance 41. This is because the electrical effects of the contact inductance 44 and the contact resistance 45 are typically nominal in comparison to the intrinsic capacitance and resistance, except at frequencies far above the transition frequency. In other words, the effects of the contacts to the RTD are can usually be ignored when designing a circuits that includes one or more RTDs.

However, for atypical RTDS, and for selected frequencies very far above the transition frequency, the effects of the contact inductance and contact resistance may become significant in regard to the electrical operation of the RTD. In these situations, it is desirable that the external circuitry used to resonate the RTD be chosen so as to provide the complex conjugate reactance of the entire RTD equivalent circuit, rather than just the complex conjugate reactance of the intrinsic capacitance 43. In other words, the external circuit can be configured to cancel not only the intrinsic capacitance of the RTD, but also the effective terminal reactance of the RTD. If an accurate electrical equivalent model for the RTD is available, the optimum external inductance can be found by calculation.

Figure 11:
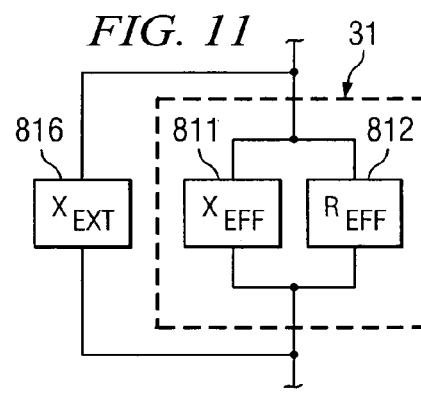
FIG. 11 is a schematic circuit diagram showing an equivalent circuit which is an alternative to the equivalent circuit of FIG. 2.

As discussed above, FIG. 2 shows an equivalent circuit for the RTD 31, which includes resistance 41, capacitance 43, inductance 44, and resistance 45. However, the equivalent circuit for each RTD can alternatively be represented as a parallel combination of a reactance and a resistance. In this regard, FIG. 11 is a schematic circuit diagram that includes an equivalent circuit for the RTD 31 which is an alternative to the equivalent circuit shown in FIG. 2. In FIG. 11, the RTD 31 is represented by an equivalent circuit which includes a parallel combination of a reactance $X_{EFF}$ at 811, and a resistance $R_{EFF}$ at 812. A resonating external inductance $X_{EXT}$ is provided at 816, and is coupled in parallel with the RTD 31. The inductance of the resonating external inductance $X_{EXT}$ at 816 is chosen so that, at a selected frequency, the reactance $X_{EFF}$ at 811 is additively canceled by the external inductance $X_{EXT}$ at 816. Alternatively, direct electrical measurements on the RTD using a vector network analyzer can provide the equivalent terminal reactance and resistance of the RTD. The optimum resonating inductance would then be the inductance value that resonates the measured equivalent terminal capacitance at the selected frequency.

The present invention provides a number of advantages. One such advantage results from the provision of structure which resonates with a reactance of a resonant tunneling diode at a selected high frequency. The reactance of the tunneling device is thus rendered essentially negligible at that selected frequency, thereby permitting the device to operate substantially normally at that frequency, even where that frequency is well above a transition frequency which would otherwise represent the effective upper limit of the operational range of the device. A related advantage is that there is a savings in drive and signal power at the selected frequency.

A further advantage is realized where the structure which provides the resonance is rendered ineffective at frequencies below the transition frequency. This effectively provides the tunneling device with two different modes of operation, one of which is a narrowband mode at the selected frequency above the transition frequency, and the other of which is a wideband mode throughout a range of frequencies below the transition frequency.

Although several selected embodiments have been illustrated and described in detail, it will be understood that a wide variety of substitutions and alterations are possible without departing from the spirit and scope of the present invention, as defined by the following claims.

What is claimed is:

1. An apparatus comprising:
a circuit being other than an oscillator that includes:
a first portion which is coupled between first and second nodes and which includes a resonant tunneling device;
a second portion which is coupled between said first and second nodes and which has an electrical reactance that includes at a selected frequency a complex conjugate reactance of a reactance of said resonant tunneling device at said selected frequency, so that at said selected frequency said complex conjugate reactance substantially cancels said reactance of said resonant tunneling device.

2. An apparatus according to claim 1, wherein said resonant tunneling device is a resonant tunneling diode.

3. An apparatus according to claim 1, wherein said first portion includes a further resonant tunneling device, said resonant tunneling devices being coupled in series with each other between said first and second nodes.

4. An apparatus according to claim 1, wherein said selected frequency is greater than 100 GHz.

5. An apparatus according to claim 1, wherein said second portion includes an inductor which is coupled between said first and second nodes, said complex conjugate reactance including an inductance of said inductor.

6. An apparatus according to claim 5, wherein said second portion includes a blocking capacitor, said inductor and said blocking capacitor being coupled in series with each other between said first and second nodes.

7. An apparatus according to claim 1, wherein said second portion includes a transmission line having two conductors which are respectively coupled to said first and second nodes, said complex conjugate reactance including an inductance of said transmission line.

8. An apparatus according to claim 7, wherein said transmission line is an open line having an electrical length which is between one-quarter and one-half of the wavelength of said selected frequency.

9. An apparatus according to claim 7, wherein said transmission line is a shorted line having an electrical length which is less than one-quarter of the wavelength of said selected frequency.

10. An apparatus according to claim 9, wherein said second portion includes first and second blocking capacitors which are each coupled between a respective terminal of said resonant tunneling device and a respective said conductor of said transmission line.

11. An apparatus according to claim 1, wherein said second portion includes a transformer having first and second coils, said second coil being coupled between said first and second nodes and being part of said second portion of said circuit, said complex conjugate reactance including an inductance of said second coil.

12. An apparatus according to claim 1, wherein said second portion includes a plurality of components with respective impedances that collectively define said complex conjugate reactance, said plurality of components including at least one inductor and at least one capacitor.

13. An apparatus according to claim 1, wherein said reactance of said resonant tunneling device includes an intrinsic capacitance and a terminal reactance of said resonant tunneling device.

14. An apparatus according to claim 1, wherein said reactance of said resonant tunneling device includes an intrinsic capacitance of said resonant tunneling device but excludes a terminal reactance of said resonant tunneling device.

15. The apparatus of claim 1, wherein the first portion and the second portion are part of a switch.

16. The apparatus of claim 1, wherein the first portion and the second portion are part of an amplifier.

17. A method of operating a circuit other than an oscillator that includes a first portion which is coupled between first and second nodes and which includes a resonant tunneling device, and a second portion which is coupled between said first and second nodes, said method comprising:
   causing said second portion to exhibit at a selected frequency an electrical reactance that includes a complex conjugate reactance of a reactance of said resonant tunneling device at said selected frequency, so that said complex conjugate reactance substantially cancels said reactance of said resonant tunneling device at said selected frequency.

18. A method according to claim 17, including selecting a resonant tunneling diode to serve as said resonant tunneling device.

19. A method according to claim 17, including selecting a frequency in excess of 100 GHz to be said selected frequency.

20. A method according to claim 17, including configuring said second portion to have an inductor which is coupled between said first and second nodes, said complex conjugate reactance including an inductance of said inductor.

21. A method according to claim 17, including configuring said second portion to have a transmission line with two conductors that are respectively coupled to said first and second nodes, said complex conjugate reactance including an inductance of said transmission line.

22. A method according to claim 17, wherein said selecting of said reactance of said resonant tunneling device is carried out to include an intrinsic capacitance and a terminal reactance of said resonant tunneling device.

23. An apparatus according to claim 17, wherein said selecting of said reactance of said resonant tunneling device is carried out to include an intrinsic capacitance of said resonant tunneling device and to exclude a terminal reactance of said resonant tunneling device.

24. The method of claim 17, wherein the first portion and the second portion are part of a switch.

25. The method of claim 17, wherein the first portion and the second portion are part of an amplifier.

26. The method of claim 17, wherein the selected frequency is the frequency of a clock signal provided to the circuit.

27. An apparatus comprising a circuit that includes:
   a first portion which is coupled between first and second nodes and which includes a resonant tunneling device;
   a second portion which is coupled between said first and second nodes and which has an electrical reactance that includes at a selected frequency a complex conjugate reactance of a reactance of said resonant tunneling device at said selected frequency, so that at said selected frequency said complex conjugate reactance substantially cancels said reactance of said resonant tunneling device; and
   a clock signal source having a frequency approximately the same as the selected frequency.

* * * * *